United States Patent [19]

Ari et al.

[11] Patent Number: 4,661,763
[45] Date of Patent: Apr. 28, 1987

[54] PHASE SHIFTER

[75] Inventors: Niyazi Ari, Nussbaumen; Gerhard Linhofer, Baden, both of Switzerland

[73] Assignee: BBC Brown, Boveri & Company, Limited, Baden, Switzerland

[21] Appl. No.: 698,845

[22] Filed: Feb. 6, 1985

[30] Foreign Application Priority Data

Feb. 10, 1984 [CH] Switzerland .......................... 647/84

[51] Int. Cl.$^4$ ............................. G05F 1/70; H02J 3/18
[52] U.S. Cl. .................................... 323/215; 323/217; 323/218
[58] Field of Search ............... 323/209, 210, 215, 217, 323/218, 259, 344

[56] References Cited

U.S. PATENT DOCUMENTS

| 3,975,673 | 8/1976 | Boshnyaga et al. | 323/215 |
| 4,013,942 | 3/1977 | Boshnyaga et al. | 323/215 |
| 4,438,386 | 3/1984 | Gyugyi | 323/210 |
| 4,555,659 | 11/1985 | Gyugyi | 323/210 |

FOREIGN PATENT DOCUMENTS 590553 1/1934 Fed. Rep. of Germany .
1207251 9/1970 United Kingdom .

OTHER PUBLICATIONS

John A. Ebert, "Giant Phase Shifting Transformers", pp. 14–18, Allis Chambers Engineering Review, vol. 33, No. 1, 1968.
R. M. Mathur, "A Thyristor Controlled Static Phase–Shifter for AC Power Transmission", pp. 1–6, IEEE 1980 Power Engineering Society, Jul. 1980.

Primary Examiner—Patrick R. Salce
Assistant Examiner—Emanuel Todd Voeltz
Attorney, Agent, or Firm—Burns, Doane, Swecker & Mathis

[57] ABSTRACT

Phase shifters are used in meshed, multi-phase power supply systems for improving their transmission stability and for load-flow regulating purposes. In order to be able to use a less costly exciter transformer of lower rating or the tertiary or compensation winding of a system coupling transformer for generating intermediate-circuit voltages as a function of system input voltages, a resonant circuit is provided between the exciter transformer and an auxiliary transformer. In this resonant circuit consisting of series-connected capacitors and inductive resistances which are connected to taps between these capacitors and can be switched in and out by means of alternating-current switches, tap voltages are generated which are supplied to the primary windings of the auxiliary transformer. At the secondary windings, connected in series with phase conductors of the auxiliary transformer, auxiliary voltages occur which are superimposed on the system input voltages and effect the desired phase shifts. Instead of air chokes which can be switched off, chokes with a ferromagnetic core or the impedance of a transformer, the secondary winding of which can be short-circuited by means of an alternating-current switch, can also be used as variable inductive resistances in the resonant circuit. The inductive resistances can also be star-connected instead of delta-connected.

11 Claims, 8 Drawing Figures

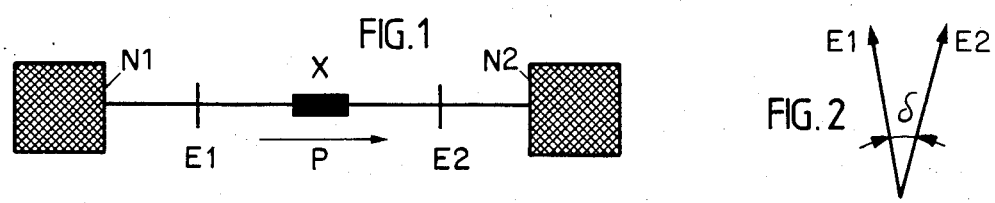
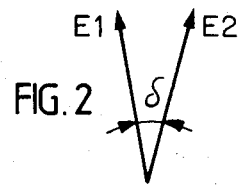
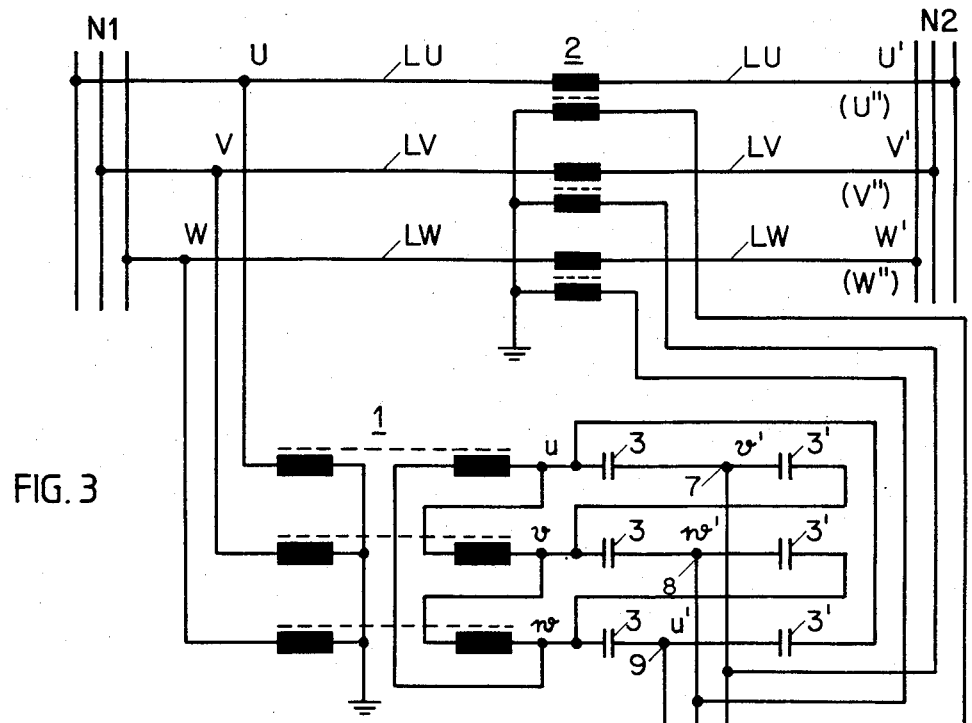
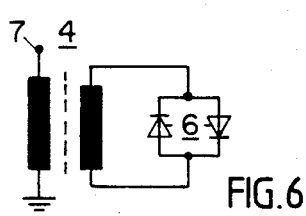
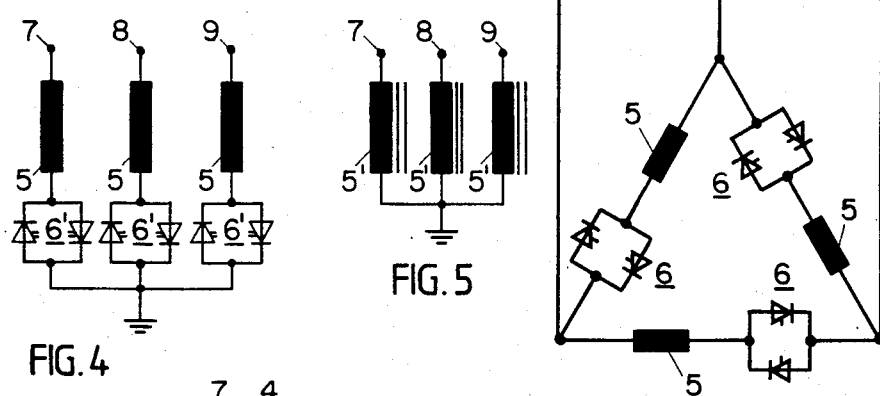
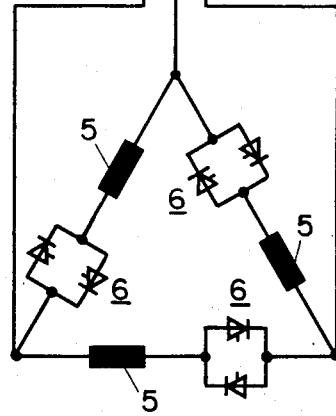

PHASE SHIFTER

BACKGROUND OF THE INVENTION

The present invention relates to a phase shifter used in meshed power supply systems for improving the transmission of energy and for preventing detrimental reactive effects on the power supply system and the generators when high-voltage lines are switched together.

The flow of energy between two system points connected by lines is determined by the phase angle between the voltages at these points and by the impedance between the two points. These relationships are illustrated in FIGS. 1 and 2. In FIG. 1, N1 and N2 designate the two part systems for three-phase current for the electric transfer and distribution of energy which are connected with each other by a line. E1 and E2 designates the voltages on the bus bars of N1 and N2, X the impedance between E1 and E2, or the series impedance of the line if only only line exists, and P the electric power transferred, for which the following applies:

$$P \approx E1 \cdot E2 \cdot \sin \delta / X,$$

where $\delta$ is the phase angle between the voltages E1 and E2, see FIG. 2.

In a three-phase transmission arrangement, two of the main problems are the stability of transmission and the regulation of load flow in the system.

Regarding transmission stability, as the phase angle between two part systems increases, the synchronizing torque keeping the generators of the two part systems in step with each other is reduced. This means that even small short-term system disturbances can lead to loss of synchronization between the power stations linked by the transmission lines. As a rule, with the generator control systems used today and the short fault-elimination times which can be achieved with modern circuit breakers, the limit of dynamic stability is at a phase angle of approximately 30° and that of the transient stability even below this value. By phase angle in this case is meant the angle between the voltage vectors at the beginning and at the end of the line. The angle between the voltage vectors of the internal generator voltages is correspondingly greater. Frequently, with long transmission distances not even the natural line performance can be utilized without exceeding the stability limit. For improving the transmission characteristic of lines and simultaneously supporting stability, series capacitors and controllable shunt compensation are used as conventional measures.

Wtih respect to load-flow regulation, the load flow within an electric system is largely self-regulating. If a deficiency of effective power exists in a part system, this immediately results in a trailing phase angle with respect to the other part systems. This, in turn, causes an immediate increase of the flow of effective power in the direction of the part system having the deficiency of effective power.

Difficulties occur then in ring systems, in highly meshed systems and if part systems are connected to each other via several lines of different voltage levels. Since the load flow through a line is self-regulating as a function of phase angle and series impedance of the lines, it can happen that the individual lines are subjected to greatly differing loads. In most cases, this creates unnecessarily high transmission losses and in extreme cases lines can even be overloaded. This is remedied by devices such as, for example, quadrature regulators which introduce an auxiliary voltage having a phase displacement of 90° or also by phase-angle regulators introducing an auxiliary voltage having a phase displacement of 30° or 60°.

Prior art phase shifters are described, for example, in IEEE Transactions on Power Apparatus and Systems, Vol. PAS-100, No. 5, May 1981, pages 2650-2655. In this description, in the intermediate circuit between an exciter transformer which is fed by the system voltage and which generates an intermediate-circuit voltage, and an auxiliary transformer which generates an auxiliary voltage and the secondary winding of which is connected in series with the power line to be influenced by the power system, a choke coil is provided which is connected either in parallel or in series with the primary winding of the auxiliary transformer. In the former case, an alternating-current switch containing antiparallel-connected thyristors is connected in series and in the second case in parallel with the primary winding of the auxiliary transformer. This makes it possible to add voltage components which are phase shifted by 90° and have a predetermined amplitude according to the inductance of the choke coil to the system phase voltages during predeterminable time intervals. This publication also discloses the generation of an auxiliary voltage from the voltage drop of a thyristor-controlled choke coil.

At a maximum, the amplitude of the alternating voltage supplied to the primary winding of the auxiliary transformer is in this case equal to the amplitude of the output voltage occurring at the secondary winding of the exciter transformer. In order to generate an auxiliary voltage of a certain amplitude, the exciter transformer must be designed to have a relatively high rating.

BRIEF SUMMARY OF THE INVENTION

One object of the present invention is to provide a phase shifter in which the transformer generating the intermediate-circuit voltage can be designed to have a lower rating.

An advantage of the invention consists in a cost reduction of the phase shifter. In order to generate a certain auxiliary voltage, the required operating range of the transformer generating this intermediate-circuit voltage is comparatively smaller. This is achieved by using a resonant circuit in the intermediate circuit between the two transformers. A large change in voltage can be effected with slight detuning of the resonant circuit. Since the auxiliary voltage is partially generated by a resonant effect, the type rating of the exciter transformer can be selected to be smaller than the booster rating or the rating of the auxiliary transformer, which is not possible in the case of other quadrature regulator designs.

According to an advantageous development of the invention, more flexibility is achieved with respect to the phase and the amplitude of the auxiliary voltage to be generated. The phase can be predetermined in a simple manner for each alternating-current phase by the size of the series-connected capacitors, and the amplitude can be predetermined by changing the inductance of inductive resistances which are each connected to a tap between the capacitors. Simultaneously, the capacitors in the resonant circuit cause the line inductance to be reduced and cause the power supply system to have better static stability with respect to disturbances occurring in the system, such as, for example, a short to earth.

It is especially advantageous to use as the inductive resistance a choke having a ferromagnetic core which, as the current intensity through the choke increases, goes into saturation and thus causes a change in resistance. If necessary, this makes it possible to eliminate the necessity of connecting an alternating-current switch in series with the choke.

Another advantage consists in the fact that the exciter transformer does not have to be provided with a regulating winding with taps. Since many system coupling transformers are equipped with a tertiary or compensation winding, the intermediate circuit of the quadrature regulator can be directly connected to this compensation winding which in many cases obviates the procurement of a separate exciter transformer.

The phase shifter according to the invention represents an advantageous combination of a quick-response controllable static quadrature or phase-angle regulator comprising a controllable series compensation arrangement.

BRIEF DESCRIPTION OF THE DRAWINGS

A preferred embodiment of the invention is illustrated in the accompanying drawings, wherein:

FIGS. 1 and 2 show basic diagrams of a power supply system and the phase angle occurring in the system, illustrating of the energy flow in meshed power supply systems, FIG. 3 shows an illustrative embodiment of the invention, FIGS. 4 to 6 show various variable reactances which can be used instead of the reactances in the illustrative embodiment of FIG. 3.

DETAILED DESCRIPTION OF THE PREFERRED EMBODIMENT

Figure 7:
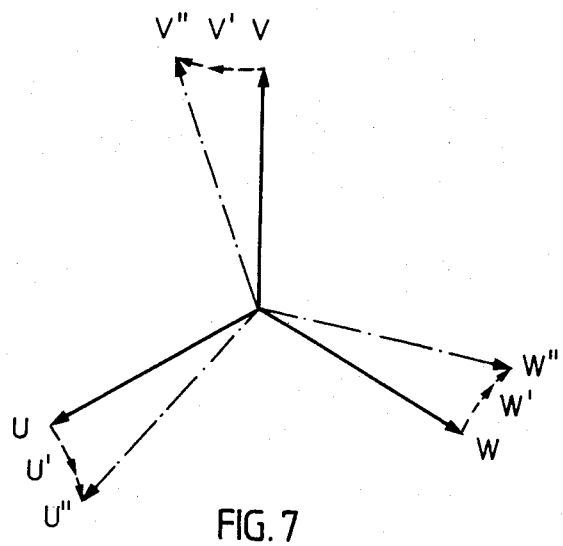
FIG. 7 shows a vector diagram of the vectorial addition of the auxiliary voltages to the input voltages.

In FIG. 3, 1 designates an exciter transformer, the three primary windings of which are star-connected to three phase conductors LU, LV, LW at which input voltages U, V, W of the part system N1 carrying three-phase current are present. The neutral point is grounded. At secondary-side terminals of 3 delta-connected secondary windings of the exciter transformer 1, the intermediate-circuit voltages u, v, w can be tapped off.

Between these secondary-side terminals of adjacent three-phase current phases, in each case two series-connected capacitor banks or capacitors 3 and 3' are connected. At each tap 7, 8 and 9 in the electric connection between the two capacitors 3 and 3' in each case tap voltages v', w', u' can be tapped off. Each of these three taps 7, 8 and 9 is connected to the other taps by a series circuit consisting of an air choke 5 and an alternating-current switch 6 of antiparallel-connected thyristors.

In series with each of the phase conductors LU, LV, LW, the phases of which are to be influenced, one secondary winding of a booster or auxiliary transformer 2 is connected to the 3 primary windings which, on the one hand, are grounded and, on the other hand, are connected to the three taps 7, 8 and 9 between the series-connected capacitors 3 and 3'. In this arrangement, the primary winding, which influences the system input voltage U, of the auxiliary transformer 2 is connected to the tap 9 at which the tap voltage u' and at the capacitor 3 of which the intermediate-circuit voltage w is present. The two other primary windings of 2, which influence the system input voltages V and W, are correspondingly connected to the taps 7 and 8.

At the secondary windings of the auxiliary transformer 2, on the one hand, the system voltages U, V, W are present and, on the other hand, the regulated output voltages U', V', W' in no-load operation or U", V", W''' with resistive and inductive loading, not shown. The auxiliary voltages U'-U and U"-U and so forth are produced by these secondary windings.

FIG. 7 shows the associated voltage vector diagram, the resultant output voltages being marked by the dash-dotted lines.

Figure 8:
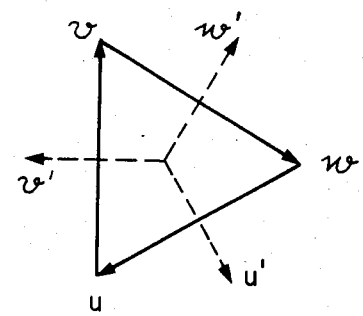
FIG. 8 shows a vector diagram of intermediate-circuit and tap voltages occurring in the intermediate circuit in an illustrative embodiment according to FIG. 3.

FIG. 8 shows the voltage relationships at the secondary-side output of the exciter transformer 1 with the intermediate-circuit voltages u, v, w and at the taps 7-9 with the tap voltages u', v', w'.

The phase relationship of the auxiliary voltage can be influenced with the aid of the capacitors 3 and 3' and the amplitude of the auxiliary voltage can be influenced by changing the inductance of the inductive resistances or chokes 5, utilizing the resonant effect between inductance and capacitance. In this arrangement, the change in inductance is carried out by the controllable antiparallel-connected thyristor valves 6. The magnitude of the capacitance of the capacitors and of the inductance of the inductive resistances is determined as a function of the required intermediate-circuit voltage, the phase displacement needed and the throughput rating. Capacitances within the range of 1 $\mu$F and 300 $\mu$F and inductances of 50 mH and more are customary.

Instead of the delta connection of the air chokes 5 shown in FIG. 3, a star connection as shown in FIG. 4 can also be used, each air choke 5 being connected on the one hand to a tap 7 or 8 or 9 and, on the other hand, via an alternating-current switch 6' to the other air chokes 5 and grounded. In this arrangement, antiparallel-connected thyristors, which can be turned off, are provided as alternating-current switches and enable the air chokes 5 to be switched in and out several times within one half cycle of the alternating current. This makes it possible to reduce the harmonics content of the alternating current.

As shown in FIG. 5, chokes 5' having a ferromagnetic core, preferably an iron core, can also be used instead of the air chokes 5 of FIG. 4. The cores are saturated above an intensity of saturation current so that the inductance of the chokes becomes less with increasing current intensity above this saturation-current intensity. In this circuit, the alternating-current switches 6' of FIG. 4 are omitted.

Instead of the chokes 5' shown in FIG. 5, transformers can also be used as variable inductive resistances, the secondary windings of which transformers are in each case connected to an alternating-current switch consisting of two antiparallel-connected thyristors. For the sake of simplicity, only one transformer 4 for one phase of the alternating current is shown in FIG. 6. The primary winding of this transformer 4 is connected on the one hand to the tap 7 and, on the other hand, to ground. The alternating-current switch 6 can be used to short-circuit and disconnect the secondary circuit of the transformer 4. If the secondary circuit of the transformer 4 is open, the relatively large no-load inductance is effective in its primary circuit. If the secondary circuit is closed, only the smaller so-called short-circuit or stray impedance of the transformer is effective. Compared with a switching element connected in series with an inductive resistance, the alternating-current switch 6 in the secondary circuit of the transformer 4 offers the advantage that it needs to be designed only for the stepped-down, and therefore much lower, secondary voltage of the transformer 4.

Naturally, the variable inductive resistances according to FIGS. 5 and 6 can also be used in delta connection as in FIG. 3. Instead of the thyristor switches 6', which can be turned off, according to FIG. 4, thyristor switches 6 according to FIGS. 3 and 6 can also be used and, conversely, instead of the thyristor switches 6 the thyristor switches 6' comprising thyristors which can be turned off. The important factor is that the inductance in the resonant circuit can be changed as a function of the desired auxiliary voltage.

Instead of individual capacitors 3 and 3', several parallel-connected capacitors can also be used.

Instead of the resonant circuit shown in FIG. 3, between the exciter transformer 1 and the auxiliary transformer 2, a different alternating-current resonant circuit can also be used. Thus, instead of the capacitors 3 and 3', variable inductive resistances and instead of the variable inductive resistances 5, star- or delta-capacitors can be used.

Instead of a star-delta-connected exciter transformer, naturally a delta-star-connected exciter transformer can also be used. It is advantageous but not necessary if the phase of the intermediate-circuit voltage u, v, w is shifted by 90° C. with respect to the system input voltage U, V, W.

We claim:

1. A phase shifter, particularly for a multi-phase power supply system, having
   (a) at least one first transformer, which at its input is fed by a system input voltage for each phase of the alternating current and which has for each phase at least one output winding at which, in operation, an intermediate-circuit voltage can be tapped off,
   (b) at least one auxiliary transformer which, for each phase of the alternating voltage, has at least one primary and at least one secondary winding, the primary windings being fed as a function of said intermediate-circuit voltages and the secondary windings being series-connected with phase conductors which are to be influenced with respect to phase, wherein
   (c) the output windings for generating the intermediate-circuit voltages of the first transformers are operatively connected by at least one controllable resonant circuit to the primary windings of the auxiliary transformer,
   (d) said controllable resonant circuit for each alternating current phase is provided with at least one first capacitor which is series-connected to at least one second capacitor, the output of each first capacitor being operatively connected to the input of each second capacitor and being provided with a tap at which a tap voltage can be tapped off for feeding the primary winding of the auxiliary transformer,
   (e) the input of the first capacitor is operatively connected to an output winding of the first transformer,
   (f) the output of each second capacitor is operatively connected to an input of the first capacitor of a cyclically adjacent alternating-current phase, and
   (g) each tap is operatively connected via at least one controllable inductive resistance to each other tap.

2. A phase shifter according to claim 1, wherein the controllable inductive resistances are connected to each other in delta connection.

3. A phase shifter according to claim 2, wherein at least one controllable inductive resistance is provided with at least one air choke in series with one alternating-current switch.

4. A phase shifter according to claim 2, wherein at least one controllable inductive resistance is a transformer having an alternating-current switch arranged in the secondary circuit.

5. A phase shifter according to claim 2, wherein at least one controllable inductive resistance is provided with at least one choke having a ferromagnetic core.

6. A phase shifter according to claim 3, wherein the alternating-current switch is provided with anti-parallel-connected controllable electric valves comprising thyristors which can be turned off.

7. A phase shifter according to claim 1, wherein the controllable inductive resistances are connected to each other in star connection.

8. A phase shifter according to claim 7, wherein at least one controllable inductive resistance is provided with at least one air choke in series with one alternating-current switch.

9. A phase shifter according to claim 8, wherein the alternating-current switch is provided with antiparallel-connected controllable electric valves comprising thyristors which can be turned off.

10. A phase shifter according to claim 7, wherein at least one controllable inductive resistance is a transformer having an alternating current switch arranged in the secondary circuit.

11. A phase shifter according to claim 7, wherein at least one controllable inductive resistance is provided with at least one choke having a ferromagnetic core.

* * * * *